(12) United States Patent
Mitra et al.

(10) Patent No.: US 7,188,284 B2
(45) Date of Patent: Mar. 6, 2007

(54) ERROR DETECTING CIRCUIT

(75) Inventors: Subhasish Mitra, Rancho Cordova, CA (US); Kee S. Kim, El Dorado Hills, CA (US); Tak M. Mak, Union City, CA (US); Prashant M. Goteti, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 261 days.

(21) Appl. No.: 10/882,523

(22) Filed: Jun. 30, 2004

(65) Prior Publication Data

US 2006/0005091 A1    Jan. 5, 2006

(51) Int. Cl.
*G01R 31/28* (2006.01)
(52) U.S. Cl. .................... 714/726; 714/731
(58) Field of Classification Search .......... None
See application file for complete search history.

(56) References Cited

U.S. PATENT DOCUMENTS

| | | | |
|---|---|---|---|
| 6,023,778 A | 2/2000 | Li | |
| 6,029,261 A * | 2/2000 | Hartmann | 714/724 |
| 6,708,284 B2 * | 3/2004 | Smith | 714/10 |
| 6,735,731 B2 * | 5/2004 | Ewen et al. | 714/733 |
| 2003/0046643 A1 | 3/2003 | Ohta | |
| 2003/0222677 A1 | 12/2003 | Komaki | |
| 2004/0041610 A1 | 3/2004 | Kundu | |
| 2004/0243893 A1 * | 12/2004 | Mudge et al. | 714/724 |

* cited by examiner

*Primary Examiner*—Christine T. Tu
(74) *Attorney, Agent, or Firm*—Schwabe, Williamson & Wyatt, P.C.

(57) ABSTRACT

In one embodiment, an apparatus includes a datapath circuit to generate a data output signal in response to a data input signal and at least a first data clock signal; a shadow circuit, coupled to the datapath circuit, to generate a shadow output signal in response the data input signal and at least a second data clock signal during a functional mode of operation and to generate a scan-out signal in response to a scan-in signal and at least a first test clock signal during a test mode of operation; and an error detect circuit, coupled to the datapath and the shadow circuits, to generate an error signal in response to a mismatch between the data output signal and the shadow output signal.

28 Claims, 7 Drawing Sheets

US 7,188,284 B2

ERROR DETECTING CIRCUIT

BACKGROUND OF THE INVENTION

1. Field of the Invention

The present invention relates to electronic devices, and in particular, to errors in electronic devices.

2. Description of Related Art

Radiation-induced transient errors in digital systems are often referred to as single event upsets (SEUs) or soft errors. Soft errors are mainly caused by radiation due to neutrons generated by cosmic rays from deep space and alpha particles from packaging material. Traditionally, soft errors are a major cause of concern mainly for space applications. However, for designs manufactured at technology nodes 130 nm and below, soft errors are gaining in importance even for terrestrial applications. Examples include processors and networking equipments targeted for high RAS (Reliability, Availability and Serviceability) applications. A major reason for increased significance of soft errors is the increased number of transistors inside an integrated circuit chip. Soft error rates of individual circuit blocks (e.g., memory cells) have not significantly increased over technology generations; however, an increased number of transistors inside a single chip results in increased chip level error rate. In addition to these soft errors, errors are generated in latches due to general noise and amplifier errors.

Corrupted latches and flip-flops may lead to incorrect machine states resulting in silent data corruption or system crash depending on where and when the error occurred. For example, errors in datapath latches or flip-flops may lead to silent data corruption if the errors are left undetected.

Conventional techniques such as error detection and correction are routinely employed to cope with soft errors in memories. The most usual concurrent error detection technique is to duplicate and compare. Other conventional techniques for soft error resilience of digital circuits include using radiation hardened materials and special circuit design techniques. In addition, many techniques developed in the context of fault-tolerant computing are also applicable. Most of these techniques either may require very sophisticated circuit design, architectural changes, changes in the software code and incur significant area, power or performance penalties or may be applicable to special designs such as for microprocessors.

While scan and other Design-For-Testability (DFT) mechanisms address manufacturing tests, they are not used in normal operation in the field. In scan cells, well-known sequential-test problems may be avoided by turning flip-flops (sometimes referred to as bistable devices, registers and master-slave latches) of a Device-Under-Test (DUT) at input and output nodes of combinational logic circuits into externally loadable and readable elements. During a test mode, these flip-flops are chained together as a single serial shift register to form a scan path. With respect to a given combinational logic circuit, serial data of an appropriate test pattern (vector) is loaded into flip-flops at an input node to set it to a predetermined state. The combinational logic circuit then functions in a normal manner, with the test pattern propagating through the logic circuit. The system response to the test pattern is latched by flip-flops at an output node and then are shifted out of the DUT in a scan-out operation and analyzed for improper operation.

Referring to FIG. 1, one conventional hold scan cell 10 is shown which is used for DFT purposes. The hold scan cell 10 provides a full shadow of the machine state and enables non-intrusive operation while the chip (not shown) is running or while the system clocks are frozen. Several versions of these types of scan cells exist and FIG. 1 illustrates only one type. The scan cell 10 includes a first flip-flop 12 (also referred to as a master-slave latch, register or bistable device) having a first datapath latch L1 and a second datapath latch L2 interposed in a datapath to receive DATA and clocks CLK1 and CLK2 (which may be two phases of a system clock) and to provide an output Q. The cell 10 further includes a second flip-flop 14 having a first shadow latch L3 and a second shadow latch L4. The scan cell 10 has two modes of operation: a normal or functional mode and a test mode. During the normal mode, clocks ACLK and BCLK and a signal Load are set at a logic value 0, and clocks CLK1 and CLK2 are applied. During the test mode, at a first scan cell 10 at an input node, clocks ACLK and BCLK are applied alternately to shift in (scan in) a test pattern or scan-in signal SI into shadow latches L3 and L4. Next, the store enable clock STORE_EN is applied to move the contents of latch L4 to latch L2 so that the test pattern has been written into the first flip-flop 12 and then applied in the normal fashion to a combinational logic circuit (not shown). A second cell 10 receives the system response to the test pattern from the logic circuit. The clock CLK1 of the second cell 10 is applied which captures or latches the system response in the latch L1, followed by applying the clock CLK2 which moves the latched contents of the latch L1 to the latch L2. Finally, the Load signal is applied which moves the contents of latch L2 into latch L3. The system response or scan-out signal SO may now be scanned out by alternately applying clocks ACLK and BCLK.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 1:
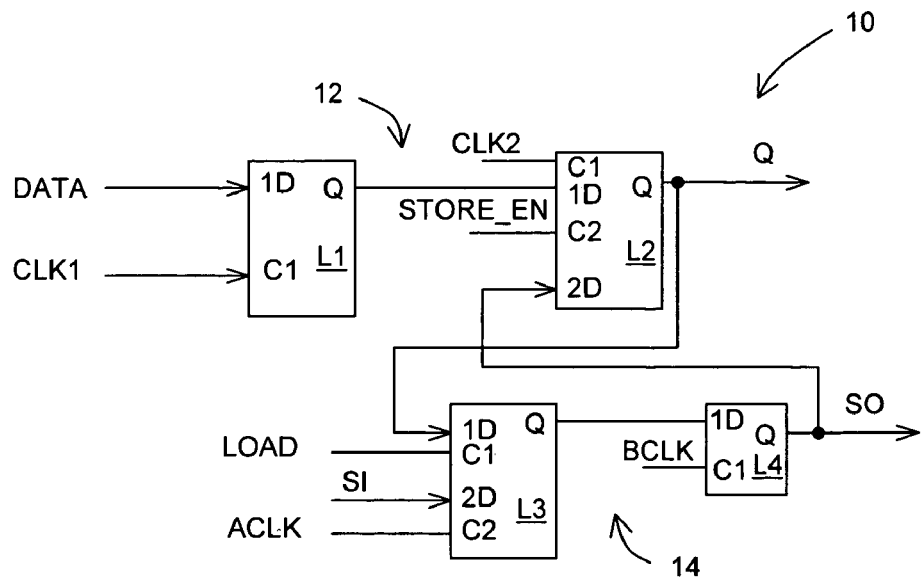
FIG. 1 is a block circuit diagram of a conventional scan cell.
Figure 2:
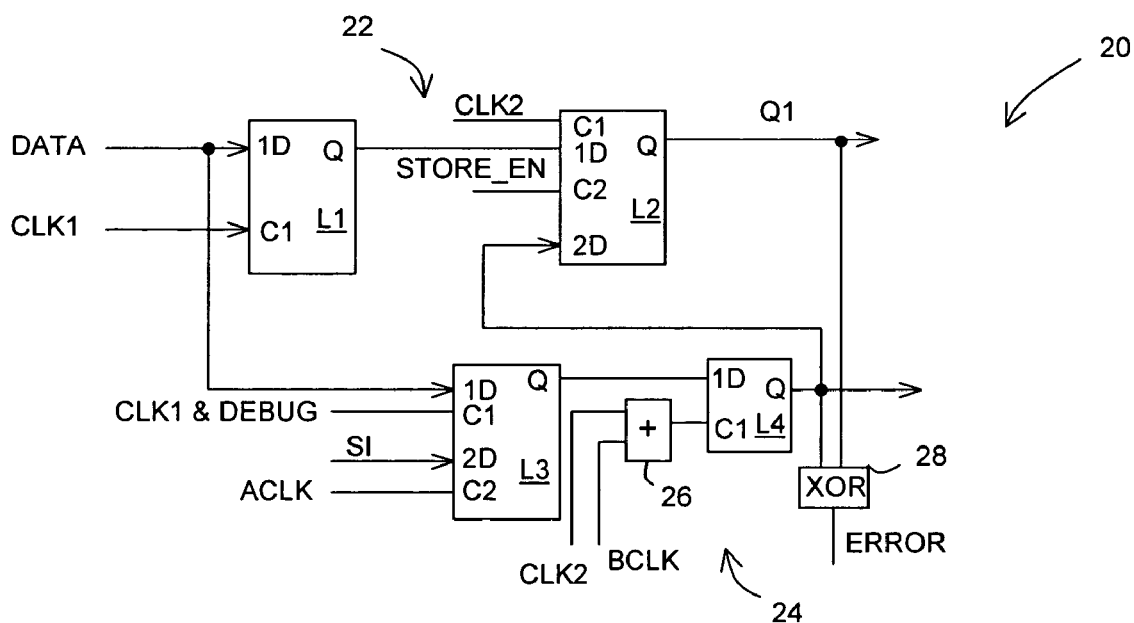
FIG. 2 is a block circuit diagram of a four latch scan cell according to one embodiment of the present invention.

Referring to FIG. 2, there is illustrated a self-checking, full-hold scan cell 20, in accordance with one embodiment of the invention, for an integrated circuit (IC) chip (not shown). The scan cell 20 has DFT resources available on-chip for scan-based structural testing purposes, as described with respect to FIG. 1. In the prior art approach, these DFT resources are not used after manufacturing testing when the IC chip is distributed into the field and used in a normal run-time operation, sometimes referred to as a "functional mode" of operation. To the contrary, in the scan cell 20, according to one embodiment of the invention, these DFT resources are reused during the functional mode of the IC chip for error detection. More specifically, the prior art practice of just protecting memory from soft errors is not sufficient. These DFT resources may be reused for soft error resilience in latches of the chip during the functional mode. Furthermore, the DFT resources may be used to provide error resiliency for other types of errors in the latches, such as manufacturing errors missed during manufacturing tests. Unlike radiation hardening techniques of the prior art, this approach may insure detection of all errors caused by single event upsets while not requiring any parity prediction logic or extra latches and flip-flops. Depending on which scan cell design is used, as well be discussed hereinafter, there may be no extra routing overhead unlike parity prediction approaches. Finally, error detection may come almost for no significant additional manufacturing costs, since the same resources may be used for debugging and testing. In summary, built-in design features already available on-chip for test and debug purposes, and which would not be used during the functional mode, may be reused during the functional mode for detection of errors including, but not limited to, soft errors.

Referring to FIG. 2, the scan cell 20 in an IC chip (not shown) includes the same DFT resources described with respect to FIG. 1. The cell 20 has a test mode and a functional mode of operation, with the test mode operating similar to that described in FIG. 1. On the other hand, the functional mode operates with additional error detection. The cell 20 may include a first flip-flop 22 having a first datapath latch L1 and a second datapath latch L2 interposed in a data path of the chip, with a 1D input of the second datapath latch L2 being coupled to a Q output of the first datapath latch L1. The datapath latches L1 and L2 may be a master latch and a slave latch, respectively, in which the output of the master latch L1 is the input of the slave latch L2, and the output of the slave latch L2 provides the output of the flip-flop 22. The cell 20 further may include a shadow circuit comprising a second flip-flop 24 having a first shadow latch L3 and a second shadow latch L4. The first shadow latch L3 may have its Q output coupled to the 1D input terminal of the second shadow latch L4. Again, the first shadow latch L3 and the second shadow latch L4 may be master and slave latches, respectively. The flip-flop 22, which is in a datapath of the chip, may be referred to as a "datapath circuit". The flip-flop 24, which shadows the datapath circuit (flip-flop 22), may be referred to as a "shadow circuit"

A data input signal DATA is commonly coupled to the 1D inputs of both the first datapath latch L1 and the first shadow latch L3. The first datapath latch L1 also receives a data clock signal CLK1 on its C1 input. The second datapath latch L2 receives a data clock signal CLK2 on its C1 input, an enable store signal STORE_EN on its C2 input, and an output signal from the Q output of the second shadow latch L4 on its 2D input. The data clocks CLK1 and CLK2 may be two phases of a system clock or separate clocks. The first shadow latch L3 also may receive a clock/debug signal CLK1 & Debug on its C1 input, a test pattern (scan-in signal) SI on its 2D terminal and a test clock signal ACLK on its C2 terminal. The data clock signal CLK2 and a test clock signal BLCK may be coupled to a C1 terminal of the second shadow latch L4 through an OR logic gate 26. The data output signal at the Q output terminal of the second datapath latch L2 and the shadow output signal at the Q output terminal of the second shadow latch L4 may be coupled to an error detect circuit or element 28, which may be an exclusive OR (XOR) gate.

During the functional (normal) mode, the cell 20 has its two flip-flops 22 and 24 configured to be two flip-flops operating in parallel with the same data source, i.e., the data input signal DATA. Thus, if one of the latches L1 or L2 is affected by an error, the shadow latch L3 or L4, respectively, will contain the correct value. The error detect circuit 28 may compare the contents of the second datapath latch L2 and the second shadow latch L4 and may indicate an error (ERROR signal) if there is a mismatch. During the functional mode, test clocks ACLK and BCLK and a signal Debug may be set to a logic value 0, and data clocks CLK1 and CLK2 may be applied to both of the flip-flops 22 and 24 so that the parallel operation will proceed. In this mode, the cell 20 may detect errors in latches during normal operation of the chip or system. One focus is on errors caused by single event upsets or soft errors due to alpha particles and neutrons; however, other errors may be detected, such as manufacturing errors in the latches which were not detected during manufacturing tests and errors due to noise.

During the test mode, the scan, debug and testing with a test pattern (scan-in signal SI) may be shifted into a first scan cell 20 at an input node in a similar manner as described with respect to FIG. 1. Referring to FIG. 2, at the first scan cell 20 at the input node, test clocks ACLK and BCLK may be applied alternately to shift in (scan in) the test pattern SI into the first shadow latch L3 and the second shadow latch L4. Next, the store enable clock STORE_EN may be applied to the second datapath latch L2 to move the contents of the second shadow latch L4 to the second datapath latch L2 so that the test pattern has been written into the flip-flop 22, which then may be applied in the normal fashion to a combinational logic circuit (not shown). A second scan cell 20 may receive the system response to the test pattern from the combinational logic circuit. Unlike the embodiment of FIG. 1, it is unnecessary to move the contents of the second datapath latch L2 into the first shadow latch L3, because with the scan cell 20 the contents of the first shadow latch L3 and the second shadow latch L4 already include the system response. During test mode, the signal CLK1 & Debug may be set to a logic value 1 so that the test response may be scanned out while tests are running. More specifically, the system response may now be scanned out by alternately applying test clocks ACLK and BCLK.

Figure 3:
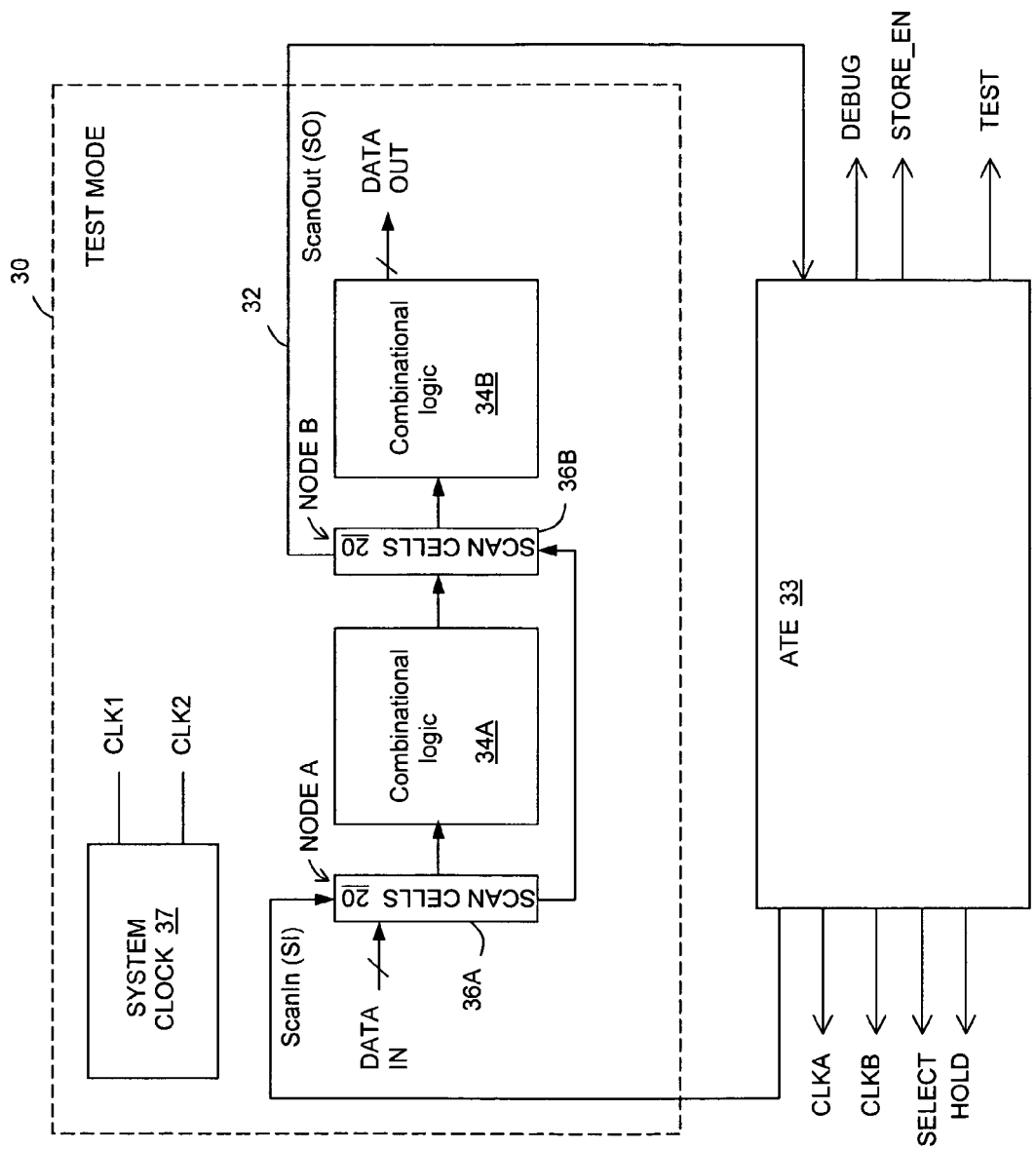
FIG. 3 is a block diagram of an integrated circuit chip having a plurality of scan cells coupled to automatic test equipment during a test mode of operation.

Referring to FIG. 3, an integrated circuit (IC) chip 30 is shown, which has a scan chain 32 consisting of a plurality of scan cells 20 chained together to form a single serial shift register during the test mode of operation when the chip is coupled to automatic test equipment 33. The integrated circuit of the chip 30 may be divided into a plurality of combinational logic circuits 34, as illustrated by a simplified example of combinational logic circuits 34A and 34B. The chip 30 may have a plurality of registers 36 interposed between the combinational logic circuits 34, as illustrated by the simplified example of a first register 36A at a node A and a second register 36B at a second node B. Each resister 36 may be an N-bit-wide clocked register; hence, each register 36 may have N scan cells 20 to receive an N-bit wide DATA signal. The datapath flip-flops of the scan cells 20 (flip-flop 22 in FIG. 2) in a data path of the chip 30 may be general-purpose clocked storage elements that make sequential and state logic design feasible. With respect to the shadow circuit (flip-flop 24 in FIG. 2), the interposing of registers 36 makes the DUT into a combinational entity for test purposes. In other words, the sequential-test difficulty of having too many possibilities to test may be avoided. Although the scan chain 32 is described as including the scan cells 20, the scan chain 32 may also include scan cells of other embodiments to be described hereinafter. The scan cells 20 include flip-flops in a register-based clocking system. As will be explained hereinafter, in a latch-based clocking system, each of the scan cells may use a single latch, instead of the master-slave latches of scan cells 20.

The output of each shadow flip-flop (shadow circuit) of the scan cells 20 in the scan chain 32 may be coupled to the input of another shadow flip-flop, which in turn means not only are the N shadow flip-flops of each register 36 connected, but the last shadow flip-flop of one register 36 is coupled to the first shadow flip-flop of the next register 36 until the last register, as shown by the connection between registers 36A and 36B. In this simplified example, the register 36A may represent the first register in the scan chain 32; hence, it may receive one or more test patterns SI. The register 36B may represent the last register in the scan chain 32; hence, it may provide the system response Scan-Out to the test pattern(s). The creation of the scan chain 32 may allow each of the serially-connected shadow flip-flops to be an externally loadable and readable element. In this simplified example, to control the circuit node A, an appropriate test pattern may be generated, loaded into the register 36A (scan cells 20) via a Scan-In pin, and propagated through the combinational logic circuit 34A. The system response of the combinational logic circuit 34A to the test pattern may be latched by the register 36B. After being latched, the system response may be shifted out of the integrated circuit of the chip 30 though a Scan-Out pin and then compared with expected data. A new test pattern may be loaded simultaneously with the shifting out the system response. FIG. 3 represents the scan cells in their test mode with the data clocks CLK1 and CLK2 frozen; hence, the data paths for the input DATA signal and the output DATA signal are interrupted, as previously described with respect to FIG. 2. With the full-hold scan cell embodiments, testing may also be performed at a low frequency during the normal operations. A partial hold scan cell embodiment is described hereinafter with respect to FIG. 6 which does not permit such testing during normal operations. A system clock 37 may generate the data clocks CLK1 and CLK2.

Figure 4:
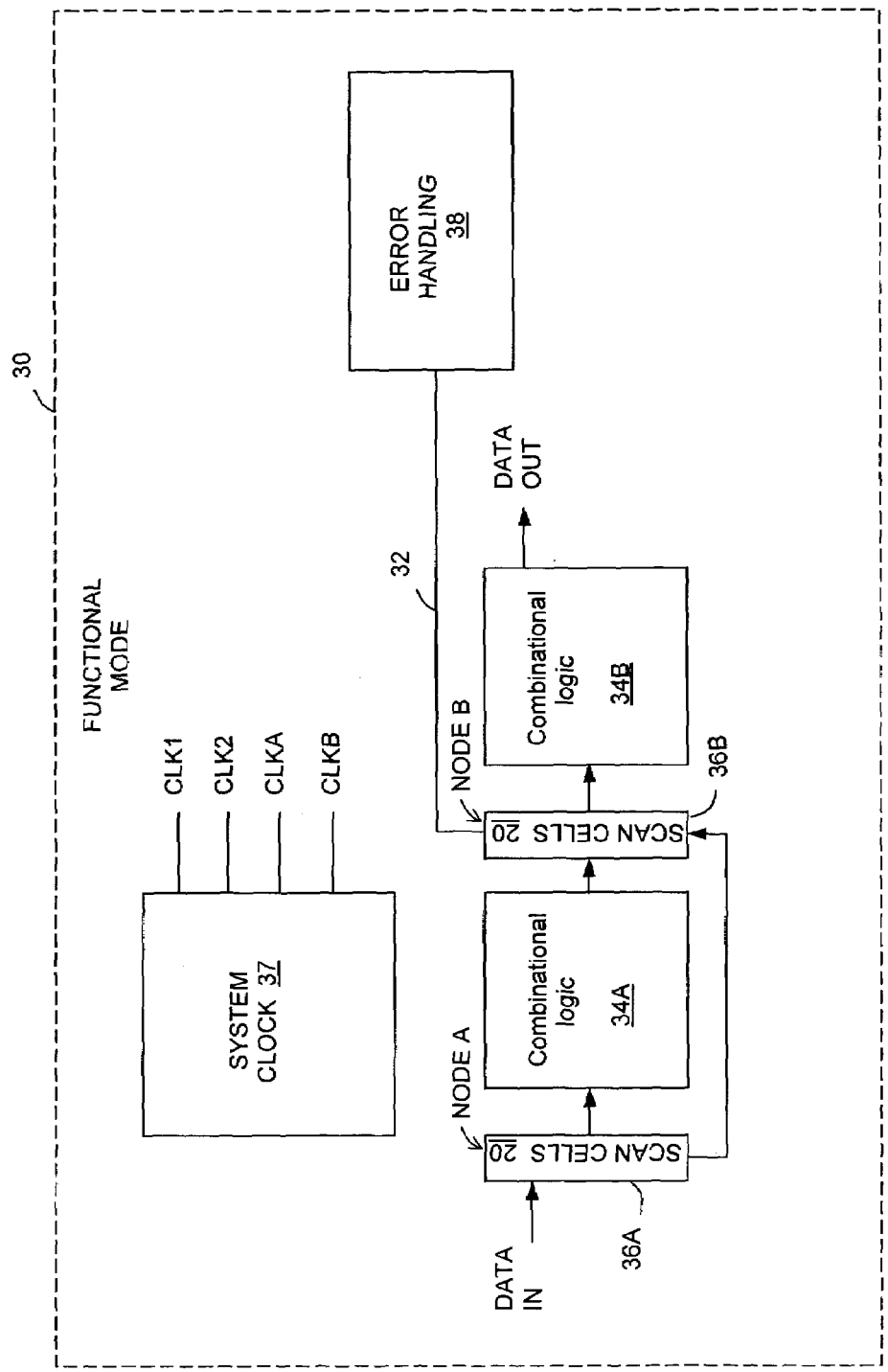
FIG. 4 is a block diagram of the integrated circuit chip of FIG. 3 during a functional mode of operation according to the various embodiments of the invention.
Figure 5:
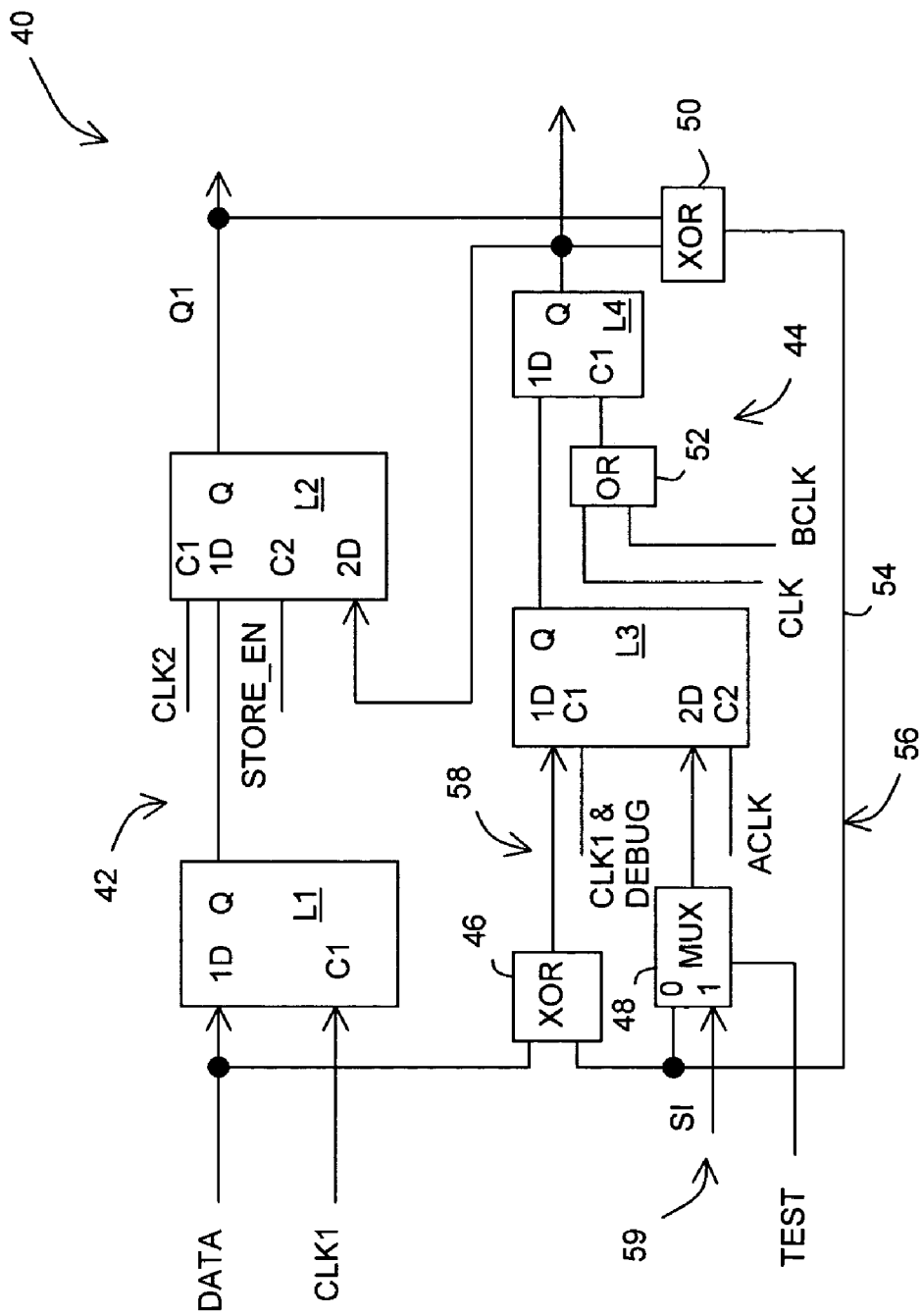
FIG. 5 is a block circuit diagram of an error trapping cell according to another embodiment of the present invention.

Referring to FIGS. 2 and 4, the error generated during the functional mode of operation by the error detect circuit or XOR 28 of FIG. 2 needs to be observable, just as the system response to the test pattern is observable by using the scan chain 32 of FIG. 3. In one embodiment, the error may be made observable by reusing the scan chain 32 of FIG. 3 during the functional mode of operation. FIG. 4 shows such a reuse of the scan chain 32 in the chip 30 for this purpose during the functional mode of operation. Unlike the test mode of operation shown in FIG. 3, the automatic test equipment is not available during the functional mode of operation in FIG. 4. The illustrated combinational logic circuits 34 and registers 36 are the same as described in FIG. 3. In one embodiment, XOR gate 28 of FIG. 2 may be implemented inside the flip-flop 24 and in another embodiment the XOR gate 28 may be implemented outside the flip-flop 24. In either embodiment, the output of the XOR gate 28 may have a logic value 1 if there is an error. In one embodiment, the XOR gate outputs may be stored in a fifth latch (not shown), that may be scanned out during the functional mode of operation, using the scan chain 32 of FIG. 4. In another embodiment, to be described hereinafter with respect to FIG. 5, the fifth register is not needed. With a redesign of the scan cell, as shown in FIG. 5, the error signals may be trapped inside the scan cell and propagated along the scan chain 32 of FIG. 4 when desired. This scan cell may be called error trapping scan cell. In another embodiment, trade-offs may be made regarding which nodes are observed. In another embodiment, a single output may be obtained through an XOR-tree (not shown) using a network separate from the scan-chain 32 of FIG. 3. In another embodiment, a signature register may be used. With these last two mentioned embodiments, extra routing may be needed.

Regardless of the structure for collecting the errors from the XOR gate, the errors may be fed to an error trapping mechanism 38 shown in FIG. 4. The chip 30 may already have an existing error handling mechanism 38 as part of the on-chip error handling mechanism for error code correction (ECC) types of errors, such as for cache/memory self checking. The error handling mechanism 38 may also be implemented off-chip. The function of this error handling mechanism 38 is to process the error(s) that it receives. Sometimes, the error may be tolerable and the system may make a log and move on. Sometimes, the error may be so severe that the current execution will have to be stopped and restarted (e.g., from a known good checkpoint). Hence, an error signal from the scan cells may create similar events as if there is an uncorrectable ECC (memory) event.

Referring to FIG. 5, the error trapping cell 40 is illustrated. This error trapping cell 40 may have broader application than merely to scan cells. For example, in one embodiment the error trapping cell 40 may comprise a first flip-flop 42 and a second flip-flop 44, operated in parallel, wherein the second flip-flop 44 is merely used for error detection. In other words, neither of the flip-flops 42 or 44 is a scan flip-flop. In another embodiment, the flip-flop 44 may be a scan flip-flop and the cell 40 may have a test mode and a functional mode of operation, as previously described with the earlier embodiments. The first flip-flop 42 may have a first datapath latch L1 and a second datapath latch L2 interposed in a data path of the chip, with a 1D input of the second datapath latch L2 being coupled to a Q output of the first datapath latch L1. The datapath latches L1 and L2 may be a master latch and a slave latch, respectively, in which the output of the master latch L1 is the input of the slave latch L2, and the output of the slave latch L2 provides the output of the flip-flop 42. The error trapping cell 40 may have a shadow circuit comprising the second flip-flop 44 having a first shadow latch L3 and a second shadow latch L4. Hence, the flip-flop 42 may be described as the "datapath circuit" and the flip-flop 44 may be described as the "shadow circuit". Again, the first shadow latch L3 and the second shadow latch L4 may be master and slave latches, respectively. The cell 40 also may include an XOR logic gate 46, a multiplexer 48, an error detect circuit or element 50, and an OR logic gate 52. The error detect circuit 50 may be an XOR logic gate. A data input signal DATA may be commonly coupled to the 1D input of the first datapath latch L1 and the XOR 46. The first datapath latch L1 also may receive a data clock signal CLK1 and the datapath latch L2 may receive a data clock signal CLK2, an enable store signal STORE_EN, and an output signal from the Q output of the second shadow latch L4. The multiplexer 48 may receive a test pattern (scan-in signal) SI at its "1" terminal and the output signal from the XOR 50 at its "0" terminal, the selection of the two by the multiplexer 48 may be made by a test select signal TEST. The selected signal may be an input to a 2D terminal of the first shadow latch L3. The data clocks CLK1 and CLK2 may be two phases of a system clock or separate clocks. The first shadow latch L3 also may receive a clock/debug signal CLK1 & Debug on its C1 input and a test clock signal ACLK on its C2 terminal. The data clock signal CLK2 and a test clock signal BLCK may be coupled to a C1 terminal of the second shadow latch L4 through the OR logic gate 52. The data out signal at the Q output terminal of the second datapath latch L2 and a shadow output signal at the Q output terminal of the second shadow latch L4 may be coupled the XOR gate 50.

During the functional (normal) mode, in the absence of any error, the content of the first shadow latch L3 is equal to the contents of the first datapath latch L1 and content of the second shadow latch L4 is equal to the contents of the second datapath latch L2. However, the first time an error affects any of the individual latches, there is a mismatch and it is detected. More specifically, the operation of the XOR 50 on the data output signal Q1 from the second datapath latch L2 and the shadow output signal from the fourth latch L2 may generate a logic value 1 which may be received by the XOR 46 and the multiplexer 48. From that time onwards, the logic value in first shadow latch L3 is the complement of the logic value in the first datapath latch L1; hence, the mismatch persists. It is realistic to assume that for given failure rates a soft error strike will not create two errors in the same flip-flop—probability of that happening is very low. Hence, the flip-flops 42 and 44 continue to be mismatch as a result of which the error is trapped inside the flip-flop 44 until the error signal is scanned out.

During the functional mode of operation, the error signal may be scanned out along the existing scan chain (scan chain 32 in FIG. 4) by application of the test clock signals ACLK and BCLK and by making test select signal Test=0. This approach may not require extra routing over what already exists for the test mode of operation. The Test signal may be a relatively slow signal. In another embodiment, the Test signal may also be replaced by the Debug signal, in which case there is no extra routing. As previously mentioned, in another embodiment, a straightforward extension of the cell 40 may be to introduce a 5th latch in the system and store the error signal there as a result of which the second XOR 46 is not needed and the assumption that a single error affects a given latch may be relaxed. This error trapping cell 40 may also be implemented by replacing each flip-flop by a latch in a system using latch-based clocking, as described hereinafter with respect to FIG. 7 or a partial hold scan cell, as described hereinafter with respect to FIG. 6. The multiplexer 48 is only needed if it is desired to shift the Error signal out through scan chain 32 of FIG. 4. Otherwise, the multiplexer 48 may be eliminated and other circuitry may be used for getting the Error signal out of the chip. In either case, the error trapping (XOR 50 with feedback) may be used to trap the Error signal.

Although error trapping cell 40 is illustrated with the feedback from the XOR 50 being coupled to the first shadow latch L3 so that the error is trapped in the first shadow latch L3, the feedback may also be coupled to the second shadow latch L4 so that the error is trapped in the second shadow latch L4. In this later case, the XOR gate 46 may be moved to be interposed between the Q output of latch L3 and the 1D input of the latch L4 and the multiplexer 48 may be moved to be coupled to the 2D (not shown) input of the latch L4.

Referring to FIGS. 4 and 5, in the error trapping cell 40 described above, the output of the error detect circuit 50 may be coupled to the input of the multiplexer 48 and the logic gate 46 by a line 54. The line 54, the multiplexer 46, and the logic gate 46 may define a feedback circuit 56 for feeding back the error signal from the error detect circuit 50 to a selected one of the shadow latches L3 and L4 for storage until the error signal is read out. Hence, the feedback circuit 56 and the shadow latch L3 or L4 may be defined a storage circuit 58 for storing the error signal until the error signal is read out. In one embodiment, a read-out circuit 59 (partially shown in FIG. 5) may comprise the scan chain 32 of FIG. 4. In this embodiment, the read-out circuit 59 may be implemented by setting the multiplexer 48 to its "0" input by the Test signal so that the shadow latch L3 or L4 stores the error signal. The shadow latches L3 and L4 of FIG. 5 become part of the scan chain 32 of FIG. 4 so that the trapped error signal may be shifted out of the chip 30 via the scan chain 32. In another embodiment, a read-out circuit 59 may be designed to be used solely for the purpose of extracting the error signal and not also used for scanning out the system response during the test mode of operation, as is undertaken by the scan chain 32 of FIGS. 3 and 4. As mentioned above, in another embodiment, the storage circuit 58 may include the additional fifth latch (not shown) having an input coupled to the output of the error detect circuit 50 to receive and store the error signal until it is scanned out. The output of the fifth latch may then be connected to the read-out circuit.

Figure 6:
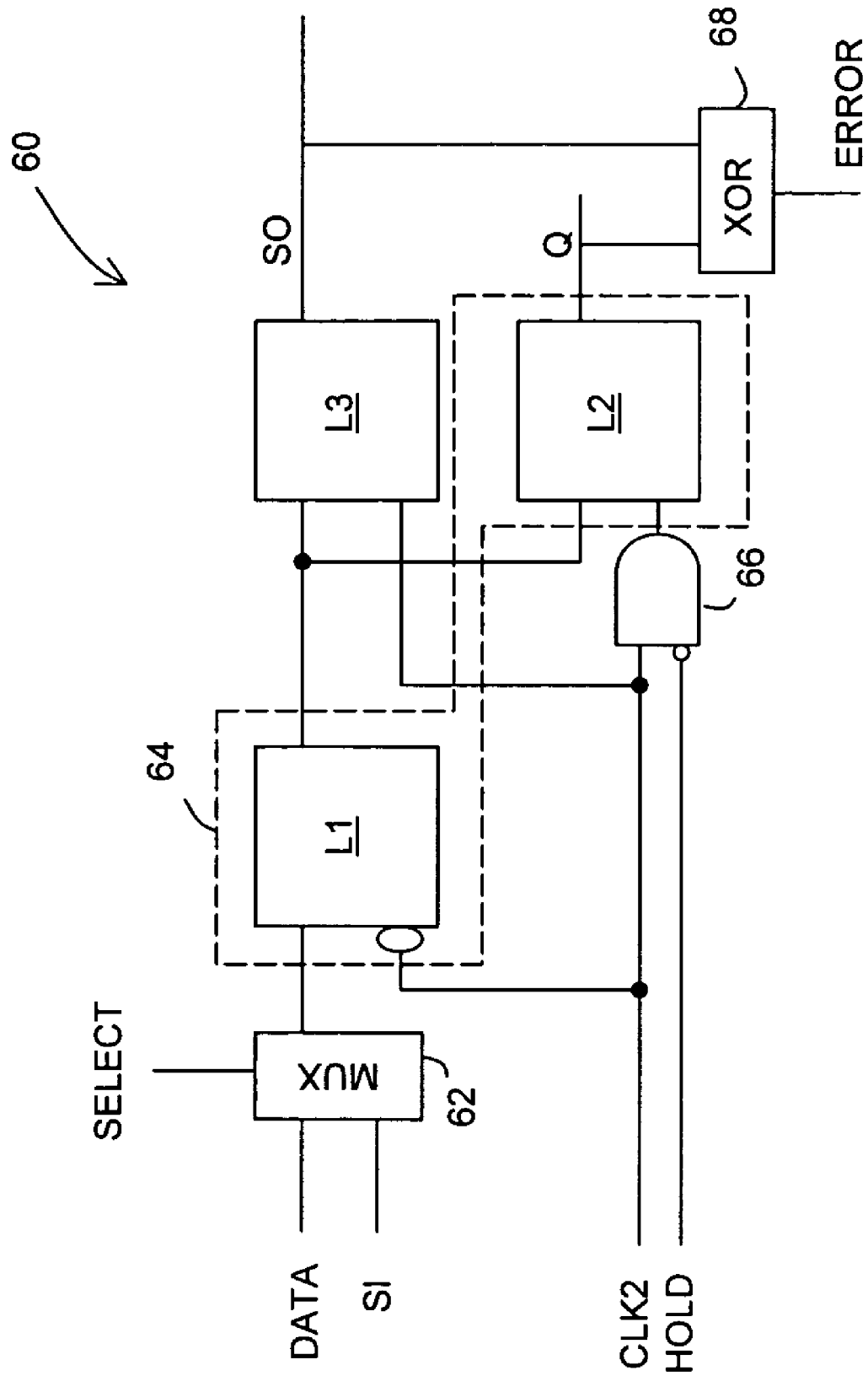
FIG. 6 is a block circuit diagram of a three latch scan cell according to another embodiment of the present invention.

The embodiments of the scan cell shown in FIGS. 2 and 5 used a full hold scan cell, i.e., there are four latches. Referring to FIG. 6, a scan cell 60, in accordance with another embodiment of the present invention, may have three latches L1, L2 and L3. In this embodiment, the first and second datapath latches L1 and L2 comprise the "datapath circuit" and the shadow latch L3 comprises the "shadow circuit". The scan cell 60 may be viewed as having two slave latches, which includes the second datapath latch L2 and the shadow latch L3. In comparison to the full hold scan cell embodiments with two master latches, the scan cell 60 may have one master latch L1. By use of multiplexing, the two master latches may be viewed as being merged into a single master latch L1. Hence, the scan cell 60 may be referred to as a partial or half hold scan cell.

The scan cell 60 may include a multiplexer 62 for receiving the data input signal DATA and the scan-in signal or test pattern SI, which functions as a selector for selecting one of the signals in response to the signal SELECT. A flip-flop 64 (i.e., the datapath circuit) may include the first datapath latch L1 and second datapath latch L2. The first datapath latch L1 latches the selected output of the multiplexer 62 in accordance with an inverted signal CLK2, i.e., the CLK1 signal. The shadow latch L3 latches the output of the first datapath latch L1 in accordance with the data clock signal CLK2. Although this embodiment is shown with two phases of the same lock being used, separate clocks may be used. The shadow latch L3 (i.e., the shadow circuit) shadows the second datapath latch L2. An AND circuit 66 receives the data clock signal CLK2 and a hold signal HOLD and outputs the result of an AND operation of these signals. The second datapath latch L2 latches the output of the first datapath latch L1 in accordance with the output of the AND circuit 66. The output terminal of the shadow latch L3 provides a scan-out output SO and the output terminal of the second datapath latch L2 provides the data signal output Q. An error detect circuit or element in the form of an XOR logic gate 68 may be coupled to the data output signal of the second datapath latch L2 and a shadow output signal of the shadow latch L3 to produce an error signal ERROR. Additionally, the scan cell 60 may be used for error trapping as described with respect to the embodiment of FIG. 6. In one embodiment, the error signal may be stored in shadow latch L3.

In operation, when the hold signal HOLD is a logic value 1, the output of the AND circuit 66 is always the logic value 0 no matter whether the data clock signal CLK2 is high or low. Accordingly, even though the output of the first datapath latch L1 is successively changed, the second datapath latch L2 keeps the same input value ("1" or "0") while the hold signal HOLD is the logic value 1. Specifically, during the test mode, the scan-in signal SI is outputted from the first datapath latch L1 in accordance with the data clock signal CLK1 and passes through the shadow latch L3 to be the scan-out signal SO, which in turn becomes the scan-in SI signal for the next flip-flop 64 in the scan chain (not shown). During this, the output Q of the second datapath latch L2 is fixed to the value ("1" or "0") held when the hold signal HOLD is input to the AND circuit 66. In the event of an error in either latch L2 and L3, the XOR logic gate 68 may produce an error signal ERROR.

Figure 7:
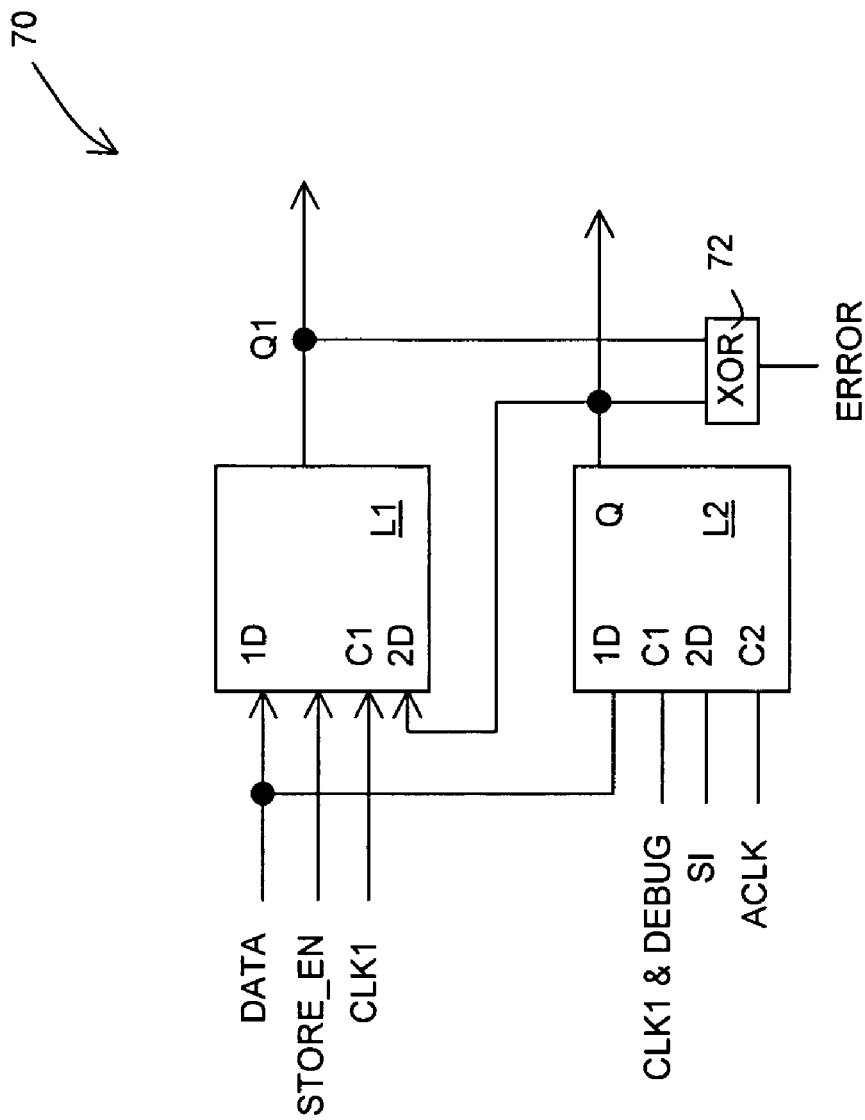
FIG. 7 is a block circuit diagram of a two latch scan cell according to another embodiment of the present invention.

Referring to FIG. 7, there is illustrated a scan cell 70 according to another embodiment of the present invention. The scan cell 70 is similar to the scan cell 20 of FIG. 2 except the chip 30 of FIG. 4 is implemented with a latched based clocking system instead of a register based clocking system. In other words, the combinational logic circuits of FIG. 4 are separated by transparent latches instead of flip-flops. Again, the cell 70 has a test mode and a functional mode of operation. The cell 70 may include a datapath latch L1 and a shadow latch L2. The functional mode operates with additional error detection. The datapath latch L1 may have the inputs of the DATA signal, the STORE_EN signal, and a Q output of the shadow latch L2. The shadow latch L2 has the inputs of the DATA signal, the CLK1 & Debug signal, the scan-in signal, and the ACLK signal. These signals operate in the same manner as described with respect to FIG. 2. The outputs of the two latches L1 and L2 are coupled to an error detect circuit or element in the form of an exclusive OR gate 72 to generate an error signal ERROR. In this embodiment, the shadow latch L2 comprises the "shadow circuit" and the datapath latch L1 comprises the "datapath circuit". Additionally, the scan cell 70 may be used for error trapping as described with respect to the embodiment of FIG. 5. In one embodiment, the error signal may be stored in shadow latch L2.

Referring back to FIG. 3, during the test mode of operation, the automatic test equipment (ATE) 33 may generate the test pattern or Scan-In signal SI and receives the system response Scan-Out (SO) for analysis. The ATE 74 also may generate the two test clock signals CLKA and CLKB used in the various embodiments to shift the Scan-in signal SI into the scan chain 32 and to shift the system response Scan-Out out of the chip 30. The test clock signals CLKA and CLKB may be two phases of the same test clock signal. The chip 30 may have the system clock 37 which generates the two data clocks CLK1 and CLK2. As previously mentioned, the two data clocks CLK1 and CLK2 may be different phases of the same system clock or they may be separate clocks. The ATE 33 also may generate the Debug and STORE_EN signals for the scan cells 20, 40 and 70 of FIGS. 2, 5 and 7 and the SELECT and HOLD signals for the scan cell 60 of FIG. 6. Although FIGS. 3 and 4 are described with respect to scan cells 20 of FIG. 2, the scan cells 40, 60 and 70 may also make up registers 36 of FIGS. 3 and 4. Moreover, the scan chain 32, in addition to including one or more of the scan cells according to the various embodiments of the invention, may also include scan cells of a prior art design, such as the one shown in FIG. 1.

Referring to FIGS. 2, 5, 6, and 7, the scan cells 20, 40, 60 and 70 may assure error detection and data integrity, may not have silent data corruption, may need no special circuit design tricks, may be scalable with technology, may reuse of test and debug resources; may need very little extra overhead; may be applicable to detection of errors from other noise sources; may be in-place; and may need very little extra routing. Moreover, use of the scan cells according to the various embodiments may avoid the need to design for a "worst-case"; may reduced amount of design effort; may avoid the need for the most accurate EDA tool; may reduced test cost by avoiding the need for expensive testers; may avoid the need for complicated test pattern generation; may avoid the need for accurate test application; may avoid the need to throw away a marginal part; may be applicable for manufacturing defects (yield enhancement); may be applicable for infant mortality failures; may be applicable for protection from soft errors; and may make automation simple.

In summary, the scan cells according to the various embodiments of the present invention: (1) may reuse onchip resources already available for test, debug or powersavings purposes during system operation for providing error resilience; (2) may incur very little (or almost negligible) routing overhead while implementing error detection unlike previous techniques that may require global routing of error signals; (3) may not need any major architectural change; (4) may be applicable to any design (e.g., microprocessors, network processors, network switches, any ASICs); and (5) may provide a broad spectrum of designs with several area, power and performance trade-offs.

Figure 8:
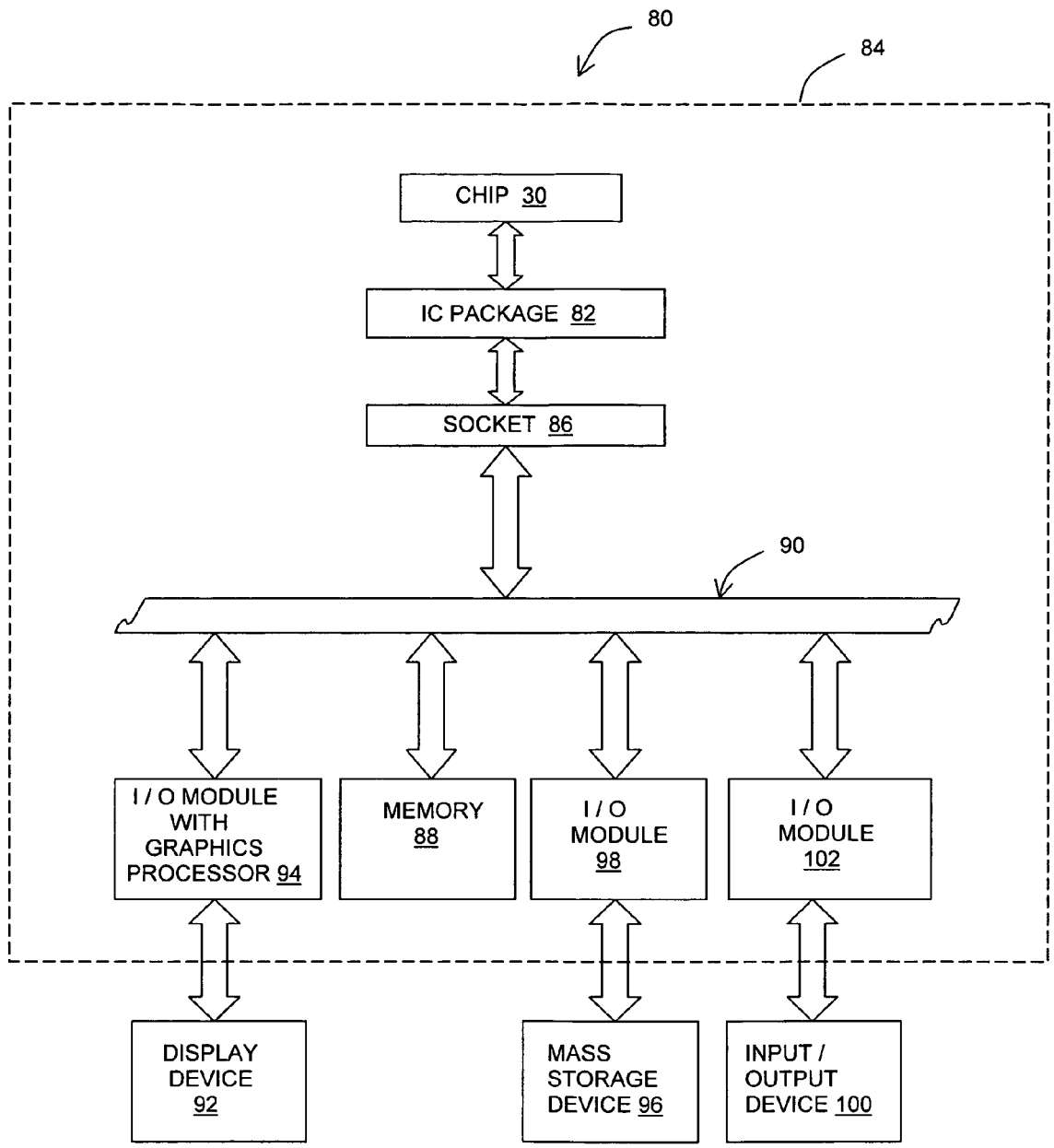
FIG. 8 is a block diagram of a system incorporating the scan cell according to the various embodiments of the present invention.

Referring to FIG. 8, there is illustrated a system 80, which is one of many possible systems in which the IC package 82, which includes the chip 30 of FIGS. 3 and 4, may be used. The chip 30 may include the scan cells 20, 40, 60, or 70 of FIGS. 2, 5, 6 and 7, respectively. In the system 80, the IC package 82 is mounted on a substrate or printed circuit board (PCB) 84 via a socket 86. The chip 30 of the IC package 82 may be a processor and the PCB 84 may be a motherboard. However, in other systems the IC package 82 may be directly coupled to the PCB 84 (eliminating the socket 86 which allows the IC package 82 to be removable). In addition to the socket 86 and the IC package 82, the PCB 84 may have mounted thereon a main memory 88 and a plurality of input/output (I/O) modules for external devices or external buses, all coupled to each other by a bus system 90 on the PCB 84. More specifically, the system 80 may include a display device 92 coupled to the bus system 90 by way of an I/O module 94, with the I/O module 94 having a graphical processor and a memory. The I/O module 94 may be mounted on the PCB 84 as shown in FIG. 8 or may be mounted on a separate expansion board. The system 80 may further include a mass storage device 96 coupled to the bus system 90 via an I/O module 98. Another I/O device 100 may be coupled to the bus system 90 via an I/O module 102. Additional I/O modules may be included for other external or peripheral devices or external buses.

Examples of the main memory 88 include, but are not limited to, static random access memory (SRAM) and dynamic random access memory (DRAM). The memory 88 may include an additional cache memory. Examples of the mass storage device 96 include, but are not limited to, a hard disk drive, a compact disk drive (CD), a digital versatile disk driver (DVD), a floppy diskette, a tape system and so forth. Examples of the input/output devices 100 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). In some cases, these communications devices may also be mounted on the PCB 84. Examples of the bus system 90 include, but are not limited to, a peripheral control interface (PCI) bus, and Industry Standard Architecture (ISA) bus, and so forth. The bus system 90 may be implemented as a single bus or as a combination of buses (e.g., system bus with expansion buses). Depending upon the external device, I/O modules internal interfaces may use programmed I/O, interrupt-driven I/O, or direct memory access (DMA) techniques for communications over the bus system 90. Depending upon the external device, external interfaces of the I/O modules may provide to the external device(s) a point-to-point parallel interface (e.g., Small Computer System Interface—SCSI) or point-to-point serial interface (e.g., EIA-232) or a multipoint serial interface (e.g., FireWire). Examples of chip 30 may include any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

In various embodiments, the system 80 may be a wireless mobile or cellular phone, a pager, a portable phone, a one-way or two-way radio, a personal digital assistant, a pocket PC, a tablet PC, a notebook PC, a desktop computer, a set-top box, an entertainment unit, a DVD player, a server, a medical device, an internet appliance and so forth.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
    a datapath circuit to generate a data output signal in response to a data input signal and at least a first data clock signal;
    a shadow circuit, coupled to the datapath circuit, to generate a shadow output signal in response the data input signal and at least a second data clock signal during a functional mode of operation and to generate a scan-out signal in response to a scan-in signal and at least a first test clock signal during a test mode of operation; and
    an error detect circuit, coupled to the datapath and the shadow circuits, to generate an error signal in response to a mismatch between the data output signal and the shadow output signal.

2. The apparatus according to claim 1, wherein the datapath circuit includes a datapath latch and the shadow circuit includes a shadow latch.

3. The apparatus according to claim 2, wherein an output of the shadow latch is coupled to an input of the datapath latch to provide the scan-out signal to the datapath latch in response to an enable signal during the test mode of operation.

4. The apparatus according to claim 2, wherein the first and the second data clock signals are the same clock signal.

5. The apparatus according to claim 1, wherein the datapath circuit includes a first datapath latch to generate a first datapath latch output signal in response to the data input signal and the first data clock signal; and a second datapath latch, coupled to the first datapath latch, to generate the data output signal in response to the first datapath latch output signal and the second data clock signal; wherein the shadow circuit includes a first shadow latch to generate a first shadow latch data output signal in response to the data input signal and the first data clock signal during the functional mode of operation and to generate a first shadow latch test output signal in response to the scan-in signal and the first test clock signal; and a second shadow latch to generate the shadow output signal in response to the first shadow latch data output signal and the second data clock signal during the functional mode of operation and to generate the scan-out signal in response to the first shadow latch test output signal and a second test clock signal during the test mode of operation.

6. The apparatus according to claim 5, wherein an output of the second shadow latch is coupled to an input of the second datapath latch to provide the scan-out signal to the second datapath latch in response to an enable signal during the test mode of operation.

7. The apparatus according to claim 5, wherein the first data clock signal is a first phase of a system clock signal; the second data clock signal is a second phase of the system clock signal; the first test clock signal is a first phase of a common test clock signal; and the second test clock signal is a second phase of the common test clock signal.

8. The apparatus according to claim 1, wherein the datapath circuit includes a first datapath latch to generate a first datapath latch output signal in response to the data input signal and the first data clock signal and a second datapath latch, coupled to the first datapath latch, to generate the data output signal in response to the first datapath latch output signal and the second data clock signal; and wherein shadow circuit includes a single shadow latch, coupled to an output terminal of the first datapath latch, to generate the shadow output signal in response to the first datapath latch output signal and the second data clock signal during the functional mode of operation and to generate the scan-out signal in response to the scan-in signal and the first test clock signal during the test mode of operation.

9. The apparatus according to claim 8, further comprising:
    a multiplexer including an output terminal coupled to an input terminal of the first datapath latch; a first input terminal to receive the data input signal; a second input terminal to receive the scan-in signal; a third input terminal to receive a select signal to select the data input signal as a multiplexer output signal on the output terminal in the functional mode of operation and to select the scan-in signal as the multiplexer output signal on the output terminal in the test mode of operation.

10. The apparatus according to claim 8, wherein the first data clock signal is a first phase of a system clock signal and the second data clock signal is a second phase of the system clock signal.

11. The apparatus according to claim 1, wherein the datapath circuit includes a first datapath latch to generate a first datapath latch output signal in response to the data input signal and the first data clock signal and a second datapath latch, coupled to the first datapath latch, to generate the data output signal in response to the first datapath latch output signal and the second data clock signal; and wherein shadow circuit includes at least one shadow latch and is coupled to a selected one of an input and an output terminal of the first datapath latch to generate the shadow output signal in response to a selected one of the data input signal and the first datapath latch output signal during the functional mode of operation.

12. The apparatus according to claim 11, wherein the first data clock signal is a first phase of a system clock signal and the second data clock signal is a second phase of the system clock signal.

13. The apparatus according to claim 1, further comprising:
a feedback circuit, having an input terminal coupled to the output terminal of the error detect circuit and an output terminal coupled to an input terminal of the shadow circuit, to provide the error signal to the shadow circuit to be stored in the shadow circuit.

14. The apparatus according to claim 1, further comprising:
a logic gate, having a pair of input terminals coupled to an output terminal of the error detect circuit and to the data input signal and an output terminal coupled to the shadow circuit, to complement the data input signal provided to the shadow circuit in response to the error signal; and
a multiplexer, having a pair of input terminals coupled to the output terminal of the error detect circuit and to the scan-in signal and an output terminal coupled to an input terminal of the shadow circuit, to provide a selected one of the error signal and the scan-in signal to the shadow circuit in response to a test select signal.

15. The apparatus according to claim 14, wherein the logic gate is an Exclusive OR gate.

16. The apparatus according to claim 1, wherein the error detect circuit is an Exclusive OR gate.

17. A system, comprising:
an integrated circuit package including a chip having a plurality of scan cells;
each of the scan cells including:
a datapath circuit including at least one datapath latch to generate a data output signal in response to a data input signal and a first data clock signal;
a shadow circuit including at least one shadow latch to generate a shadow output signal in response to the data input signal and the first data clock signal during a functional mode of operation and to generate a scan-out signal in response to a scan-in signal and a first test clock signal during a test mode of operation; and
an error detect element, having a pair of input terminals coupled to a pair of output terminals of the at least one datapath latch and the at least one shadow latch, to generate an error signal in response to a mismatch between the data output signal and the shadow output signal during the functional mode of operation; and
a bus with the integrated circuit package coupled thereto; and
a mass storage device coupled to the bus.

18. The system according to claim 17, wherein the at least one datapath latch consists of a single datapath latch and the at least one shadow latch consists of a single shadow latch.

19. The system according to claim 17, wherein the at least one datapath latch includes a first datapath latch to generate a first datapath latch output signal in response to the data input signal and the first data clock signal and a second datapath latch, coupled to the first datapath latch, to generate the data output signal in response to the first datapath latch output signal and the second data clock signal; wherein the at least one shadow latch includes a first shadow latch to generate a first shadow latch data output signal in response to the data input signal and the first data clock signal during the functional mode of operation and to generate a first shadow latch test output signal in response to the scan-in signal and the first test clock signal and a second shadow latch to generate the shadow output signal in response to the first shadow latch data output signal and the second data clock signal during the functional mode of operation and to generate the scan-out signal in response to the first shadow latch test output signal and a second test clock signal during the test mode of operation.

20. The system according to claim 17, wherein the at least one datapath latch includes a first datapath latch to generate a first datapath latch output signal in response to the data input signal and the first data clock signal and a second datapath latch, coupled to the first datapath latch, to generate the data output signal in response to the first datapath latch output signal and the second data clock signal; and wherein the at least one shadow latch includes a single shadow latch, coupled to an output terminal of the first datapath latch, to generate the shadow output signal in response to the first datapath latch output signal and the second data clock signal during the functional mode of operation and to generate the scan-out signal in response to the scan-in signal and the first test clock signal during the test mode of operation.

21. The system according to claim 17, further comprising:
a feedback circuit, having an input terminal coupled to the output terminal of the error detect element and an output terminal coupled to an input terminal of the shadow circuit, to provide the error signal to the shadow circuit to be stored in the shadow circuit.

22. The system according to claim 17, further comprising:
a logic gate, having a pair of input terminals coupled to an output terminal of the error detect element and to the data input signal and an output terminal coupled to the shadow circuit, to complement the data input signal provided to the shadow circuit in response to the error signal; and
a multiplexer, having a pair of input terminals coupled to the output terminal of the error detect element and to the scan-in signal and an output terminal coupled to an input terminal of the shadow circuit, to provide a selected one of the error signal and the scan-in signal to the shadow circuit in response to a test select signal.

23. An apparatus, comprising:
a datapath circuit to generate a data output signal in response to a data input signal and at least a first data clock signal, with the datapath circuit including at least one datapath latch;
a shadow circuit, coupled to the datapath circuit, to generate a shadow output signal in response the data input signal and at least a second data clock signal, with the shadow circuit including at least one shadow latch;
an error detect circuit, coupled to the datapath and the shadow circuits, to generate an error signal in response to a mismatch between the data output signal and the shadow output signal;
a storage circuit, coupled to the error detect circuit, to store the error signal;
the storage circuit including the shadow circuit and a feedback circuit, with the feedback circuit having an input coupled to the output of the error detect circuit and an output coupled to an input of the shadow circuit to provide the error signal to the shadow circuit to be stored; and a read-out circuit, coupled to the storage circuit, to move the error signal from the storage circuit.

24. The apparatus according to claim 23, wherein the feedback circuit includes a multiplexer, having a pair of inputs coupled to the output of the error detect circuit and to the scan-in signal and an output coupled to an input of the shadow circuit, to provide a selected one of the error signal and the scan-in signal to the shadow circuit in response to a test select signal.

25. The apparatus according to claim 24, wherein the feedback circuit further includes a logic gate, having a pair of inputs coupled to an output of the error detect circuit and to the data input signal and an output coupled to the shadow circuit, to complement the data input signal provided to the shadow circuit in response to the error signal.

26. The apparatus according to claim 25, wherein the logic gate is an Exclusive OR logic gate.

27. The apparatus according to claim 23, wherein the datapath circuit includes a master datapath latch and a slave datapath latch coupled to the master datapath latch; and the shadow circuit includes a master shadow latch and a slave shadow latch coupled to the master shadow latch.

28. An apparatus, comprising:

a datapath circuit to generate a data output signal in response to a data input signal and at least a first data clock signal;

a shadow circuit, coupled to the datapath circuit, to generate a shadow output signal in response the data input signal and at least a second data clock signal;

an error detect circuit, coupled to the datapath and the shadow circuits, to generate an error signal in response to a mismatch between the data output signal and the shadow output signal;

a storage circuit, coupled to the error detect circuit, to store the error signal; and a read-out circuit, coupled to the storage circuit, to move the error signal from the storage circuit, and wherein the shadow circuit includes at least one shadow latch to generate a shadow output signal in response to the data input signal and the first data clock signal during a functional mode of operation and to generate a scan-out signal in response to a scan-in signal and a first test clock signal during a test mode of operation.

* * * * *